US011569634B2

(12) United States Patent
Murakami et al.

(10) Patent No.: US 11,569,634 B2
(45) Date of Patent: Jan. 31, 2023

(54) LIGHT EMITTING DEVICE

(71) Applicant: NICHIA CORPORATION, Anan (JP)

(72) Inventors: Shota Murakami, Anan (JP); Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 243 days.

(21) Appl. No.: 17/111,194

(22) Filed: Dec. 3, 2020

(65) Prior Publication Data

US 2021/0175681 A1 Jun. 10, 2021

(30) Foreign Application Priority Data

Dec. 5, 2019 (JP) .............................. JP2019-220036

(51) Int. Cl.
*H01S 5/022* (2021.01)
*H01S 5/024* (2006.01)
*H01S 5/026* (2006.01)

(52) U.S. Cl.
CPC ............ *H01S 5/022* (2013.01); *H01S 5/0262* (2013.01); *H01S 5/02461* (2013.01)

(58) Field of Classification Search
CPC ..... H01L 2933/0033; H01L 2933/0066; H01L 23/04
See application file for complete search history.

(56) References Cited

U.S. PATENT DOCUMENTS

| | | | | |
|---|---|---|---|---|
| 5,293,069 A * | 3/1994 | Kato | ........................ | H01L 23/24 257/691 |
| 9,455,375 B2 * | 9/2016 | Kim | ........................ | H01L 33/62 |
| 10,122,147 B2 * | 11/2018 | Tanisaka | ............. | H01S 5/02255 |
| 2011/0158273 A1 * | 6/2011 | Okayama | ............. | H01S 5/02208 372/43.01 |
| 2012/0008025 A1 * | 1/2012 | Sasano | ............. | H01L 27/14618 348/294 |
| 2015/0221835 A1 * | 8/2015 | Tischler | .................. | H01L 33/60 438/27 |
| 2017/0122505 A1 * | 5/2017 | Kiyota | ...................... | F21V 5/04 |
| 2017/0317467 A1 * | 11/2017 | Miura | ................. | H01S 5/02253 |
| 2019/0371971 A1 * | 12/2019 | Kozuru | ................. | H01L 33/642 |
| 2020/0194968 A1 * | 6/2020 | Hashimoto | ........... | H01S 5/0071 |

(Continued)

FOREIGN PATENT DOCUMENTS

JP H04-206046 A 7/1992
JP H05-206356 A 8/1993

(Continued)

*Primary Examiner* — Andrew J Coughlin
(74) *Attorney, Agent, or Firm* — Foley & Lardner LLP

(57) ABSTRACT

A light emitting device includes: a base having a first stepped portion and a second stepped portion; a light emitting element; an electronic member configured to be irradiated by light emitted from the light emitting element; a first wiring region located on the first stepped portion; a second wiring region located on the second stepped portion; wires connected to the light emitting element and the electronic member. The wires includes a first and second wires. The first wire has a first end that is connected to the first wiring region, and a second end. The second wire has a first end that is connected to the second wiring region, and a second end. A position of the second end of the first wire relative to the bottom face is lower than a position of the second end of the second wire relative to the bottom face.

18 Claims, 6 Drawing Sheets

(56) References Cited

U.S. PATENT DOCUMENTS

| | | | |
|---|---|---|---|
| 2020/0235548 A1* | 7/2020 | Miura | H01S 5/0233 |
| 2020/0266605 A1* | 8/2020 | Kitajima | H01S 5/4056 |
| 2020/0295532 A1* | 9/2020 | Sogo | H01S 5/06825 |
| 2020/0332984 A1* | 10/2020 | Yamashita | H01L 33/505 |
| 2022/0302672 A1* | 9/2022 | Enomoto | H01S 5/02315 |

FOREIGN PATENT DOCUMENTS

| | | |
|---|---|---|
| JP | H06-302715 A | 10/1994 |
| JP | H10-321899 A | 12/1998 |
| JP | 2000-133844 A | 5/2000 |
| JP | 2002-270938 A | 9/2002 |
| JP | 2011-044456 A | 3/2011 |
| JP | 2012-009547 A | 1/2012 |
| JP | 2014-157873 A | 8/2014 |
| JP | 2018-100934 A | 6/2018 |

* cited by examiner

LIGHT EMITTING DEVICE

CROSS-REFERENCE TO RELATED APPLICATION

This application claims priority to Japanese Patent Application No. 2019-220036, filed on Dec. 5, 2019, the disclosure of which is hereby incorporated by reference in its entirety.

BACKGROUND

The present disclosure relates to a light emitting device. As disclosed in Japanese Patent Publication No. 2014-157873, an optical module having a stepped portion in a recessed base and bonding wires connected to the stepped portion is known. Furthermore, in the optical module disclosed in this patent publication, a light receiving element in addition to a light emitting element is disposed in the recessed portion.

SUMMARY

A light emitting device according to the certain embodiments includes a base, a light emitting element, an electronic member, a first wiring region, a second wiring region, a plurality of wires. The base has a bottom face and a lateral part surrounding the bottom face and extending upwards from the bottom face. The lateral part includes a first stepped portion and a second stepped portion that are each defined by an inner lateral face and an upper face. A height of the second stepped portion from the bottom face is greater than a height of the first stepped portion from the bottom face. The light emitting element is disposed on the bottom face. The electronic member is disposed on the bottom face and configured to be irradiated by light emitted from the light emitting element. The first wiring region is located on the first stepped portion. The second wiring region is located on the second stepped portion. The plurality of wires are connected to the light emitting element and the electronic member. The plurality of wires include a first wire and a second wire. The first wire has a first end that is connected to the first wiring region, and a second end. The second wire has a first end that is connected to the second wiring region, and a second end. A position of the second end of the first wire relative to the bottom face, is lower than a position of the second end of the second wire relative to the bottom face.

According to the present disclosure, in a light emitting device including a light emitting element and an electronic member, the wire bonding of the light emitting element and the electronic member can be facilitated.

DETAILED DESCRIPTION

Figure 1:
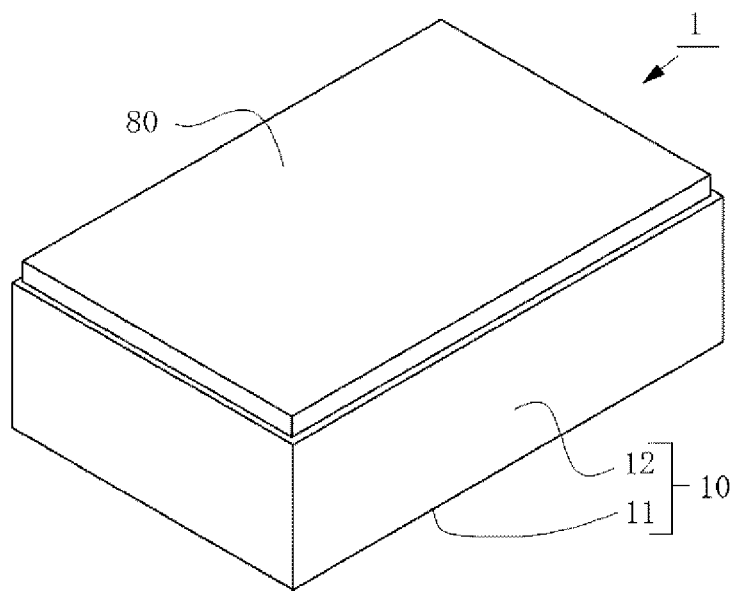
FIG. 1 is a perspective view of a light emitting device according to a first embodiment.

In the description and the accompanying claims, a polygon, such as a triangle, rectangle, or the like, including a shape subjected to processing, such as cutting angles, beveling, chamfering, rounding, or the like, will be referred to as a polygon. Moreover, the location of such processing is not limited to a corner (an end of a side). Rather, a shape subjected to processing in the middle of a side will similarly be referred to as a polygon. In other words, any polygon-based shape subjected to processing should be understood to be included in the interpretation of a "polygon" in the description and accompanying claims.

This similarly applies to any word describing a specific shape, such as a trapezoidal, circular, recessed, or projected shape, without being limited to a polygon. This also similarly applies to the sides defining such shapes. In other words, even if a corner or middle of a side is subjected to processing, the term "side" should be interpreted to include the processed portion. To distinguish a "polygon" or "side" that is intentionally not processed from a shape subjected to processing, the shape will be described by adding the phrase "exact," such as "an exact rectangle."

Moreover, in the description and accompanying claims, in the case in which there are a plurality of pieces of a certain constituent element and a distinction must be made, a word such as "first," "second," or the like might occasionally be added. The manner in which such a word is used in the description might not match the manner in which such a word is used in the claims if the subject to be distinguished or the perspective for such a distinction differs.

For example, in the case in which there are a plurality of an element denoted and distinguished by "first," "second," and "third" in the description, and a certain claim recites only those that are referred to as the "first" and "third" in the description, what are referred to as the "first" and "second" in the claim might correspond to what are referred to as the "first" and "third" in the description.

Certain embodiments of the present invention will be explained below with reference to the accompanying drawings. The embodiments described below are provided to give shape to the technical ideas of the present invention, and are not intended to limit the present invention. In the explanation below, the same designations and reference numerals denote the same or similar members, and redundant explanations will be omitted as appropriate. The sizes and relative positions of the members shown in the drawings might be exaggerated for clarity of explanation.

First Embodiment

Figure 2:
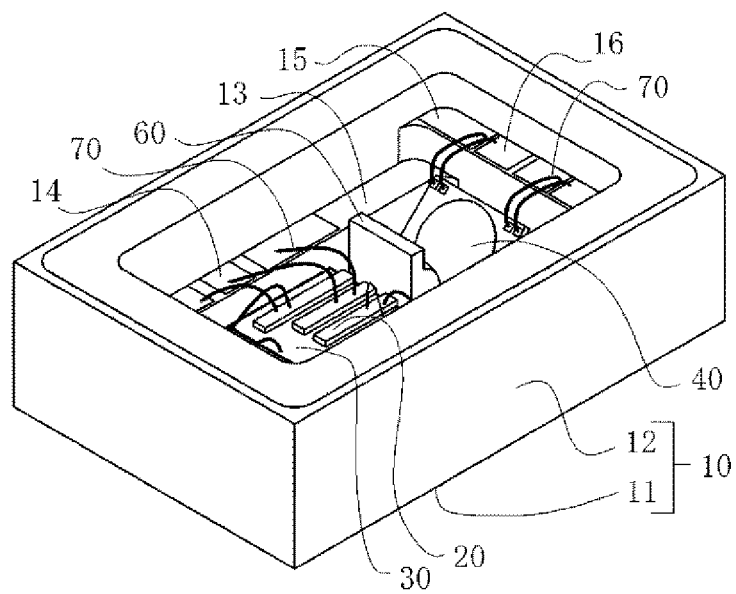
FIG. 2 is a perspective view of the light emitting device according to the first embodiment from which the cover member is removed.
Figure 3:
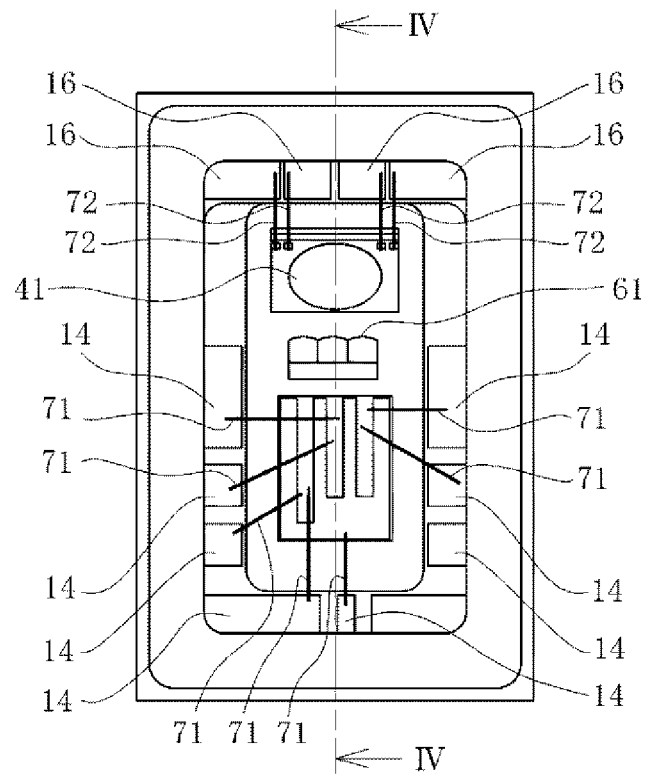
FIG. 3 is a top view of the light emitting device according to the first embodiment from which the cover member is removed.
Figure 4:
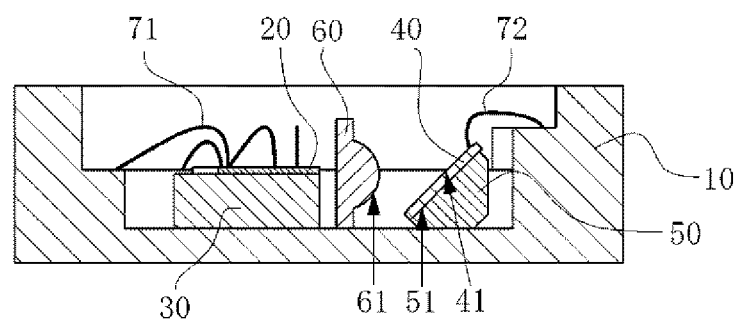
FIG. 4 is a cross-sectional view of the light emitting device taken along line IV-IV in FIG. 3.

A light emitting device 1 according to a first embodiment will be explained. FIG. 1 to FIG. 4 are drawings illustrating a light emitting device 1. FIG. 1 is a perspective view of the light emitting device 1. FIG. 2 is a perspective view of the light emitting device 1 in the state in which the cover member 80 is not shown. FIG. 3 is a top view in the same state as in FIG. 2. FIG. 4 is a cross-sectional view taken along line IV-IV in FIG. 3.

The light emitting device 1 has a plurality of constituent elements including a base 10, three semiconductor laser elements 20, a submount 30, an electronic member 40, a support member 50, an optical member 60, a plurality of wires 70, and a cover member 80 (see FIG. 4, in particular, for the support member 50).

In the light emitting device 1, the three semiconductor laser elements 20, the submount 30, the electronic member 40, the support member 50, the optical member 60, and the wires 70 are arranged in the space surrounded by the base 10 and the cover member 80. In the light emitting device 1, light is emitted by the three semiconductor laser elements 20 disposed in the space. Each constituent element will be explained first.

Base 10

The base 10 has an arrangement region in which other constituent element(s) are arranged, and lateral walls that surround the arrangement region. The base 10 has a recessed portion, which includes the arrangement region and the lateral walls. The recessed portion is depressed in the direction from the upper face to the lower face of the base 10. In the present disclosure, the bottom of the recessed portion will be referred to as the bottom face of the base 10. The bottom face of the base 10 can be a main portion of the arrangement region.

The periphery of the base 10 is rectangular in a top view. The periphery of the recessed portion is rectangular in the top view. Furthermore, in the top view, the rectangular periphery of the bottom face of the base 10 is smaller than the periphery of the recessed portion. It is not essential for any of these to have a rectangular periphery.

The base 10 has a bottom part 11 and lateral parts 12. The bottom part 11 comprises the bottom face of the base 10. The bottom part 11 includes the bottom face and the lower face of the base 10. The lateral part 12 comprises the lateral walls of the base 10. Accordingly, the lateral part 12 surrounds the bottom face of the base 10 as well as upwardly extending from the bottom face. Moreover, the lateral part 12 includes one or more outer lateral faces, one or more inner lateral faces, and an upper face meeting the outer lateral face(s) and the inner lateral face(s).

The number of inner lateral faces or the outer lateral faces depends on the shape surrounding the bottom face. For example, in the case in which the shape surrounding the bottom face is rectangular, inner lateral faces are formed to correspond to the four sides of the rectangle; i.e., there are a plurality of inner lateral faces. In the case in which the shape surrounding the bottom face is circular, one inner lateral face is formed to correspond to a circle; i.e., there is a single inner lateral face. The same is true for the outer lateral faces.

The base 10 has a plurality of stepped portions. A stepped portion is specified here as a portion composed only of an upper face and an inner lateral face(s) meeting the upper face and extending downwards therefrom. The stepped portions are included as parts of the lateral part 12 of the base 10. Each of the stepped portions is provided between the bottom face and the upper face of the base 10. In the top view, moreover, each stepped portion is formed between the periphery of the recessed portion and the periphery of the bottom face of the base 10.

Each of the stepped portions is formed along the inner lateral face of the base 10 which meet the upper face of the base 10. Accordingly, the upper face of each stepped portion meets the inner lateral face of the base 10 which meets the upper face of the base 10. The steps formed by the stepped portions extend along the entire perimeter of one or more of the inner lateral faces that surround the arrangement region of the base 10. However, the steps formed by the stepped portions do not have to be formed along the entire perimeter.

The stepped portions include a first stepped portion 13 and a second stepped portion 15. In the light emitting device 1 illustrated in the drawings, the stepped portions are configured as only of the first stepped portion 13 and the second stepped portion 15, but can have one or more additional stepped portions.

The first stepped portion 13 and the second stepped portion 15 have different heights. In other words, the heights of the upper faces of the first stepped portion 13 and the second stepped portion 15 from the bottom face of the base 10 differ. In the case of the light emitting device 1 shown in the drawings, the second stepped portion 15 is positioned higher from the bottom face than the first stepped portion 13. The base can have a first stepped portion 13 which is positioned higher than a second stepped portion 15.

The first stepped portion 13 and the second stepped portion 15 are each formed along a portion of the inner lateral faces of the base 10 that meets the upper face of the base. Accordingly, the upper face of the first stepped portion 13 meets certain portions of the inner lateral faces of the base 10 that meet the upper face of the base, and the upper face of the second stepped portion 15 meets certain portions of the inner lateral faces of the base 10 that meet portions of the upper face of the base 10 that are different from those met by the upper face of the first stepped portion 13.

In the top view, the total length of one or more of the inner lateral faces of the base 10 meeting the upper face thereof along which the first stepped portion 13 is formed is larger than the total length of the inner lateral faces along which the second stepped portion 15 is formed. Moreover, the second stepped portion 15 is formed along a portion of the overall perimeter of the one or more inner lateral faces, and the first stepped portion 13 is formed along the remaining portion of the overall perimeter.

In the light emitting device 1 illustrated in the drawings, which has a rectangular periphery defined by four inner lateral faces in the top view, the total length of the portions along which the first stepped portion 13 is formed is equal to or larger than the sum of the lengths of the two long sides of the rectangle, but equal to or less than the sum of the two long sides and one short side of the rectangle. The length of the portion along which the second stepped portion 15 is formed is equal to or larger than the length of one short side of the rectangle, but equal to or less than the length of one long side of the rectangle.

One or more of the inner lateral faces of the first stepped portion 13 have lower sides that meet the bottom face of the base 10. The inner lateral face of the second stepped portion 15 has lower side(s) that meets the base 10. Because the stepped portions are formed so as to rise from the bottom face, the stepped portions can be provided in the positions near the arrangement region. The total length of the portions where the first stepped portion 13 meets the bottom face of the base 10 is larger than the length of the portion where the second stepped portion 15 meets the bottom face of the base 10.

The lower sides of the inner lateral faces of the first stepped portion 13 do not meet the second stepped portion 15 except for the endpoints of the sides. At the endpoints, the inner lateral face of the second stepped portion 15 meets the bottom face of the base 10.

The inner lateral face of the second stepped portion 15 has a lower side meeting the bottom face of the base 10 and a lower side meeting the upper face of the first stepped portion 13. The length of the portion where the inner lateral face of the second stepped portion 15 meets the bottom face of the base 10 is larger than the length of the portions where the inner lateral face of the second stepped portion 15 meets the upper face of the first stepped portion 13. In this manner, a large bottom face as well as an adequate arrangement region can be secured.

The height of the second stepped portion 15 from the bottom face of the base 10 is preferably in the range of from 1.2 to 3.0 times the height of the first stepped portion 13 from the bottom face of the base 10. It is preferable for the height of the first stepped portion 13 to be smaller than one half of the height from the bottom face to the upper face of the base 10, and the height of the second stepped portion 15 to be larger than the height from the bottom face to the upper face of the base 10.

One or more first wiring regions 14 are provided on the upper face of the first stepped portion 13. In the light emitting device 1 illustrated in the drawings, a plurality of first wiring regions 14 are provided. The first wiring regions 14 are electrically connected through the interior of the base 10 to the wiring regions provided on the lower face of the base 10. The wiring regions to be electrically connected to the first wiring regions 14 can be provided on the outer surfaces (upper face, outer lateral faces, and/or lower face) of the base 10, without limiting the location to the lower face of the base 10.

One or more second wiring regions 16 are provided on the upper face of the second stepped portion 15. In the light emitting device 1 illustrated in the drawings, a plurality of second wiring regions 16 are provided. The second wiring regions 16 are electrically connected through the interior of the base 10 to the wiring regions disposed on the lower face of the base 10. The wiring regions to be electrically connected to the second wiring regions 16 can be provided on the outer surfaces (upper face, outer lateral faces, and/or lower face) of the base 10, without limiting the location to the lower face of the base 10.

The base 10 can be formed using a ceramic as a main material. Examples of ceramics for use as the base 10 include aluminum nitride, silicon nitride, aluminum oxide, silicon carbide, and the like.

The base 10 can be formed in such a way that the bottom part 11 and the lateral part 12 are monolithic. Alternatively, the base can be formed in a manner that the bottom part 11 and the lateral part 12 are formed using different main materials and are joined. In this case, a metal can be used as a main material for the base portion 11, and a ceramic as a main material for the lateral part 12.

In this case, furthermore, the metal employed for the bottom part 11 is preferably one having good heat dissipation properties (higher thermal conductivity) than the ceramic employed for the lateral part 12. For example, copper, aluminum, iron, as well as a composite material, such as copper-molybdenum, copper-diamond, copper-tungsten, or the like, can be used.

A metal film is disposed in the locations in the base 10 that correspond to the first wiring regions 14, the wiring regions to be electrically connected thereto, the second wiring regions 16, and the wiring regions to be electrically connected thereto. A metal material is also disposed at the locations in the interior of the base for electrical connection, which achieves the electrical connection.

Semiconductor Laser Element 20

A semiconductor laser element 20 has a rectangular periphery in the top view. The lateral face meeting one of the two short sides of the rectangle serves as the emission face through which the light exits from the semiconductor laser element 20. The upper face and the lower face of the semiconductor laser element 20 have larger areas than the emission face.

Moreover, a semiconductor laser element 20 is a multi-emitter having two emitters. An electrode shared by the two emitters is provided on one of the upper and lower faces of the semiconductor laser element 20, and two electrodes corresponding to the emitters are provided on the other face.

The light (laser beam) emitted from each emitter of a semiconductor laser element 20 spreads, forming an elliptical far field pattern (hereinafter referred to as "FFP") in a plane parallel to the emission face. FFP represents the shape and light intensity distribution of the emitted light at a location distant from the emission face.

In the present disclosure, the light passing through the center of an elliptical FFP, i.e., the light having the peak intensity in the FFP light intensity distribution, will be referred to as the light advancing along the optical axis. The light having an intensity of at least $1/e^2$ relative to the peak intensity value based on the light intensity distribution of an FFP will be referred to as the main portion of the emitted light.

The shape of the FFP of the emitted light from a semiconductor laser element 20 is an ellipse that is longer in the stacking direction of the semiconductor layers including the active layer than in the layer direction perpendicular to the stacking direction of the semiconductor layers. The layer direction will be referred to as the lateral direction of the FFP, and the stacking direction will be referred to as the vertical direction of the FFP.

Based on an FFP light intensity distribution, the angle corresponding to the full width at half maximum of the light intensity distribution will be referred to as the divergence angle of light emitted form a semiconductor laser element. The divergence angle in the vertical direction of an FFP will be referred to as vertical divergence angle, and the divergence angle in the horizontal direction of an FFP will be referred to as horizontal divergence angle.

For a semiconductor laser element 20, for example, a blue light emitting semiconductor laser element, a green light emitting semiconductor laser element, or a red light emitting laser element can be employed. A semiconductor laser element emitting light of a color other than these can be employed.

In the present disclosure, blue light refers to light having a peak emission wavelength in the 420 nm to 494 nm range, green light refers to light having a peak emission wavelength in the 495 nm to 570 nm range, and red light refers to light having a peak emission wavelength in the 605 nm to 750 nm range.

Examples of blue or green light emitting semiconductor laser elements include semiconductor laser elements including nitride semiconductors. Examples of usable nitride semiconductors include GaN, InGaN, and AlGaN. Examples of usable red light emitting semiconductor laser elements include those that include InAlGaP-based, GaInP-based, GaAs-based, and AlGaAs-based semiconductors.

Submount 30

A submount 30 is shaped as a rectangular cuboid having two opposing bonding faces. The distance between the two opposing bonding faces is smaller than the distance between the other two opposing faces. The shape of the submount 30 is not limited to a rectangular cuboid. The submount 30 can be formed with, for example, silicon nitride, aluminum nitride, or silicon carbide. A metal film is formed on the upper face of the submount 30.

Electronic Member 40

An electronic member 40 has a bonding face and a light-irradiated face. The bonding face and the light-irradiated face oppose to each other. The electronic member 40 is a part of the optical control unit that controls the light being irradiated on the light-irradiated face.

For an electronic member 40, for example, a microelectromechanical system (hereinafter referred to by using the acronym, MEMS) can be employed. Alternatively, for example, a light receiving element such as a photodiode (hereinafter referred to by using the acronym, PD) can be used. The electronic member 40 can reflect at least 80% of the light irradiated on the light-irradiated face.

Support Member 50

A support member 50 has a lower face, and an oblique face 51 that is oblique to the lower face. The oblique face 51 is not perpendicular or parallel to the lower face. For example, the oblique face 51 is formed as a plane forming an inclination angle of 45 degrees to the lower face. The inclination angle is not limited to 45 degrees. Furthermore, the support member 50 includes only the oblique face 51 or one or more additional oblique faces each oblique to the lower face of the support member 50. In the case in which the support member 50 includes the oblique face 51 and the one or more oblique faces, the oblique face 51 is one having the largest area.

Furthermore, the oblique face 51 occupies at least 60% of the area of the support member 50 in the top view. Furthermore, in the top view, the width from the upper edge to the lower edge of the oblique face 51 is at least 60% of the width of the support member 50 in the same direction. In other words, the support member 50 has the structure in which the oblique face 51 accounts for a major percentage in this direction.

The support member 50 can be formed of, for example, ceramics, glass, or metals. For example, ceramics such as aluminum nitride, glass such as quartz or borosilicate glass, and metals such as aluminum can be used. Alternatively, the support member can be formed by using Si or the like.

Optical Member 60

An optical member 60 has a bonding face and a lens face 61. The lens face 61 includes a lens shaped face. The optical member is oriented such that the lens face 61 becomes a lateral face in the case in which the bonding face is the lower face.

The lens face 61 has a shape in which a plurality of lenses are connected in a row. In the present embodiment, the lens face 61 is formed by connecting three lenses in a lateral side view. The optical member 60 can be formed by using glass, for example, BK7 glass.

Wire 70

A wire 70 has a linear shape with both ends as bonding portions. In other words, the wire has bonding portions at both ends of the linear portion to be bonded to other constituent elements. A wire 70 is, for example, a metal wire. For example, gold, aluminum, silver, copper, or the like can be used.

Cover Member 80

A cover member 80 is a plate-shaped rectangular cuboid having a lower face and an upper face. The shape does not have to be a rectangular cuboid. Furthermore, the cover member 80 has light transmissivity. Accordingly, the cover member 80 can also be referred to as a light transmissive member. A light transmissive member without having a role as a cover can be used.

In the present application, transmissivity is defined as having light transmissivity of at least 80%. It does not have to have transmissivity of at least to 80% for light of all wavelengths. The cover member 80 can have a non-transmissive region (the region having no or less light transmissivity) in one portion.

The cover member 80 can be formed of sapphire. Sapphire is a material having light transmissivity, a relatively high refractive index, and relatively high strength. Besides sapphire, glass, for example, can be used.

Light Emitting Device 1

A light emitting device 1 will be explained next. The light emitting device 1 includes a base 10, three semiconductor laser elements 20 disposed on the base 10, an electronic member 40 disposed on the base 10, and wires 70. The wires 70 includes a plurality of first wires 71 for electrically connecting the three semiconductor laser elements 20, and a plurality of second wires 72 for electrically connecting the electronic member 40.

In the light emitting device 1, the three semiconductor laser elements 20 are disposed on the base 10 via a submount 30. The semiconductor laser elements 20 can be disposed directly on the bottom face of the base 10 without interposing a submount 30. In this case, the outer shape of each semiconductor laser element 20 may be changed in order to adjust the light emitting position (height) of the emission face.

The electronic member 40 is disposed on the base 10 via a support member 50. It can be directly disposed on the bottom face of the base 10 without interposing a support member 50. In this case, the shape of the electronic member 40 may be changed in order to adjust the position (height) and the direction (inclination) of the light-irradiated face 41.

Furthermore, the light emitting device 1 includes an optical member 60 disposed on the base 10. Moreover, the light emitting device 1 includes a cover member 80 which is joined to the base 10 and seals the space in which the three semiconductor laser elements 20 are disposed.

The three semiconductor laser elements 20 are disposed on the bottom face of the base 10. Accordingly, it can be said that they are disposed on the bottom part 11 of the base 10. The three semiconductor laser elements 20 are arranged in a row such that their emission faces face the same direction. The lateral faces meeting the emission faces face one another between adjacent semiconductor laser elements 20.

The three semiconductor laser elements 20 can be composed of, for example, a blue light emitting semiconductor laser element, a green light emitting semiconductor laser element, and a red light emitting semiconductor laser element. They can be composed of multiple semiconductor laser elements emitting light of the same color, or include a semiconductor laser element emitting light of another color.

The number of semiconductor laser elements 20 disposed in a light emitting device 1 does not have to be three. The number can be more than three or less than three. Instead of the semiconductor laser elements 20, other light emitting elements such as LEDs can be used. The light emitting device 1 has at least one light emitting element.

The submount 30 is bonded to the semiconductor laser elements 20 using one bonding face, and is bonded to the bottom face of the base 10 using the other bonding face. Accordingly, it can be said that the submount is disposed on the bottom part 11 of the base 10.

The light emitting device 1 can have a plurality of submounts 30. In this case, the number of semiconductor laser elements 20 bonded to one submount 30 does not have to be three, i.e., it can be two or one. In other words, in the light emitting device 1, the submount 30 or each of the submounts 30 is bonded to at least one semiconductor laser element 20.

The electronic member 40 can be a MEMS. The electronic member 40 is disposed on the bottom face of the base 10. Accordingly, it can be said that the electronic member is arranged on the bottom part 11 of the base 10. The electronic member 40 is oriented such that the light emitted by the semiconductor laser elements 20 irradiates the light-irradiated face 41. Furthermore, the entire main portion of the light emitted by each of the three semiconductor laser elements 20 irradiates the light-irradiated face 41.

The light-irradiated face 41 upwardly reflects the laterally emitted light from the semiconductor laser elements 20. Accordingly, the light-irradiated face 41 is inclined relative to the emission faces and the optical axes. The light-irradiated face 41 is inclined at an angle of 10 to 80 degrees relative to the bottom face of the base 10.

The electronic member 40 is joined to the oblique face 51 of the support member 50. The support member 50 is positioned such that the oblique face 51 faces in the direction toward the semiconductor laser elements 20. Accordingly, it can be said that the electronic member 40 is disposed on the oblique face 51. Arranging the electronic member 40 via the support member 50 can simplify the shape of the electronic member 40. The support member 50 is preferably formed of a material more easily formable than the electronic member 40.

The lower face of the support member 50 is joined to the bottom face of the base 10. Accordingly, it can be said that the support member is disposed on the bottom part 11 of the base 10. Joining the lower face of the support member 50 to the bottom face of the base 10 allows the oblique face 51 to incline relative to the bottom face.

The optical member 60 is disposed between the emission faces of the semiconductor laser elements 20 and the light-irradiated face 41 of the electronic member 40 in the top view. Furthermore, the optical member 60 is disposed to allow the lens face 61 to face in a direction toward the light-irradiated face 41. The three lenses individually correspond to the light emitted from the three semiconductor laser elements 20. The lenses respectively collimates the light from the semiconductor laser elements 20. Accordingly, the collimated light irradiates the MEMS employed as the electronic member 40.

The MEMS reflects the irradiated light upwards. The main portions of the light from the semiconductor laser elements 20 emitted towards the electronic member 40 in a predetermined direction advance in a different direction from this. The MEMS reflects only the necessary portion of the irradiated light.

The light emitted by the semiconductor laser elements 20 diverges and is collimated by the optical member 60 before hitting the electronic member 40. Accordingly, the light-irradiated face 41 needs to extend higher than the emission points of the semiconductor laser elements 20. Accordingly, the height of the electronic member 40 is higher than the heights of the semiconductor laser elements 20.

The light-irradiated face 41 is longer at the central portion in the direction perpendicular to the bottom face of the base 10 and becomes shorter as the distance from the center increases. Accordingly, among the three semiconductor laser elements 20, one having the largest vertical divergence angle in the direction perpendicular to the bottom face is positioned in the center. This can effectively utilize the light-irradiated face 41. However, the arrangement of the semiconductor laser elements 20 is not limited to this.

In the light emitting device 1 illustrated in the drawings, the wire bonding locations for the electronic member 40 are higher than the wire bonding locations for the semiconductor laser elements 20. The light emitting device 1 shown in the drawings can improve wire bonding convenience by using the lower first stepped portion 13 for wire bonding the semiconductor laser elements 20, and the higher second stepped portion 15 for wire bonding the electronic member 40 positioned higher than the semiconductor laser elements 20.

In the state in which the submount 30 is disposed on the bottom face of the base 10, the height of the bonding face of the submount 30 for bonding the semiconductor laser elements 20 from the bottom face of the base 10 is preferably the same as, or lower than, the height of the first stepped portion 13 of the base 10. The heights of the upper faces of the semiconductor laser elements 20 from the bottom face of the base 10 preferably exceed or are higher than the height of the first stepped portion 13 of the base 10. This can facilitate connection with the first wires 71.

In the state in which the electronic member 40 is disposed on the bottom face of the base 10, the height of the electronic member 40 exceeds the height of the first stepped portion 13. The heights of the bonding locations for the second wires 72 in the electronic member 40 exceed the height of the first stepped portion 13. Furthermore, the bonding locations of the second wires 72 for the electronic member 40 are higher positioned than the upper edges of the main portions of the light irradiated on the light-irradiated face 41.

The maximum height (the height of the upper edge) of the light-irradiated face 41 of the electronic member 40 exceeds the height of the first stepped portion 13 and the heights of the semiconductor laser elements 20. The minimum height (the height of the lower edge) of the light-irradiated face 41 is smaller than the height of the first stepped portion 13 and the heights of the semiconductor laser elements 20.

In the state in which the semiconductor laser elements 20 and the electronic member 40 are disposed on the base 10, the inner lateral faces of the base 10 can be divided into two opposing planar regions between which the semiconductor laser elements 20 and the electronic member 40 are interposed in series, and two opposing planar regions between which the semiconductor laser elements 20 and electronic member 40 are interposed in parallel. In the case in which the recessed portion has a rectangular periphery in the top view as in the case of the light emitting device 1, the inner lateral faces corresponding to the four sides of the rectangle constitute the planar regions.

The inner lateral faces of the first stepped portion 13 can be formed in the two opposing planar regions between which the semiconductor laser elements 20 and the electronic member 40 are interposed in parallel. This can facilitate the positioning of the first wiring regions 14 while avoiding the optical paths of the main portions of the light.

The inner lateral face of the second stepped portion 15 can be formed in a first of the two opposing planar regions between which the semiconductor laser elements 20 and the electronic member 40 are interposed in series, the first of the two opposing planar region being located at a shorter distance from the electronic member 40 than from the semiconductor laser elements 20. Positioning the second stepped portion 15 in the rear of the light-irradiated face 41 of the electronic member 40 can more effectively prevent the stepped portion from intruding the optical paths of the light reflected by the electronic member 40.

Furthermore the inner lateral face of the first stepped portion 13 can be formed in a second of the two opposing planar regions between which the semiconductor laser elements 20 and the electronic member 40 are interposed in series, the second of the two opposing planar regions being located at a greater distance from the electronic member 40 than from the semiconductor laser elements 20. This can provide the first wiring regions 14 in the region extending in the opposite direction to the direction of travel of the light from the emission faces of the semiconductor laser elements 20, thereby facilitating the bonding of the wires 70 while avoiding the optical paths of the main portions of the light.

In the light emitting device 1 illustrated in FIG. 3, the first stepped portion 13 has two opposing inner lateral faces between which the semiconductor laser elements 20 and the electronic member 40 are interposed in parallel, and one inner lateral face in the second of the two opposing planar regions between which the semiconductor laser elements 20 and the electronic member 40 are interposed in series, the second of the two planar regions being located at a greater distance from the electronic member 40 than from the semiconductor laser elements 20. The second stepped portion 15 has one inner lateral face in the first of the two opposing planar regions between which the semiconductor laser elements 20 and the electronic member 40 are interposed in series, the first of the two planar regions being located at a shorter distance to the electronic member 40 than to the semiconductor laser elements 20.

The bonding portion at one end of each first wire 71 is bonded to a first wiring region 14, and the other bonding portion is bonded to the upper face of a semiconductor laser element 20 or the upper face of the submount 30. A bonding region for bonding with a first wire 71 is provided on the upper face of a semiconductor laser element 20 or the upper face of the submount 30.

It is not essential to connect all of the first wires 71 (i.e., all wires used to electrically connect the three semiconductor laser elements 20) to the first wiring regions 14. The bonding portion(s) of one or plural first wires 71 at one end are connected to the first wiring region(s) 14.

The bonding portion at one end of a second wire 72 is connected to a second wiring region 16. The bonding portion at the other end is connected to the electronic member 40. The electronic member 40 has a bonding region for connection with a second wire 72.

It is not essential to connect all of the second wires 72 (i.e., all wires used to electrically connect the electronic member 40) to the second wiring regions 16. The bonding portion(s) of one or plural second wires 72 at one end are connected to the second wiring region(s) 16.

The bonding region of the electronic member 40 is located higher than the center of the light-irradiated face 41. The height of the bonding region of the electronic member 40 is higher than the bonding regions of the semiconductor laser elements 20 and the submount 30. The bonding region of the electronic member 40 is preferably located in the vicinity of the upper edge of the surface where the light-irradiated face 41 is provided. Providing the bonding region in such a location can facilitate the bonding of the second wires 72.

The bonding region for the electronic member 40 with the second wires 72 is preferably positioned at a distance from the light-irradiated face 41. Providing the bonding region outside of the light-irradiated face 41 can facilitate the installation of the second wires 72 without blocking the light from the semiconductor laser elements 20.

In the light emitting device 1 illustrated in the drawings, the number of wires to electrically connect the semiconductor laser elements 20 is larger than the number of wires to electrically connect the electronic member 40. Because there are more first wires 71 than second wires 72, the number of first wiring regions 14 is larger than the number of the second wiring regions 16.

In the light emitting device 1 illustrated in the drawings, furthermore, the total length of the portions along the first stepped portion 13 is larger than the length of the portion along the second stepped portion 15. A longer stepped portion provided for disposing a larger number of wiring regions can improve a wire bonding convenience. Accordingly, the magnitude relation between the numbers of the first and second wiring regions is consistent with the magnitude relation between the lengths along the first stepped portion 13 and the second stepped portion 15.

The cover member 80 is disposed on the upper face of the base 10. It thus can be said that the cover member is disposed on the lateral part 12 of the base 10. The cover member 80 is bonded to the upper face of the base 10 positioned higher than the second stepped portion 15. The cover member 80 when joined to the base 10 creates a closed space enclosed by the base 10 and the cover member 80. This space is where the semiconductor laser elements 20 are arranged.

Furthermore, joining the cover member 80 to the base 10 under predetermined atmospheric conditions can create a hermetically sealed space. Creating a hermetically sealed space for arranging the semiconductor laser elements 20 can reduce quality degradation attributable to dust.

In the light emitting device 1, the MEMS used as the electronic member 40 can control the light exiting the light emitting device 1 through the cover member 80. The cover member 80 has light transmissivity for the light emitted from the semiconductor laser elements 80. The optical control unit can be realized by electrically connecting the electronic member 40 and a control mechanism provided outside of the light emitting device 1 via a wiring region of the base 10.

As disclosed above, in the light emitting device 1, because the bonding positions for the semiconductor laser elements 20 and the bonding positions for the electronic member 40 for electrical connection have different heights, the connection of the wires 70 is facilitated by forming the stepped portions which have different heights in the base 10. This can facilitate wire bonding.

Based on such a technical idea, a light emitting device according to the present invention is not limited to the first embodiment. In the light emitting device 1, the first wires 71 for electrically connecting the semiconductor laser elements 20 are bonded to the first stepped portion 13 which is the lower positioned stepped portion, and the second wires 72 for electrically connecting the electronic member 40 are bonded to the second stepped portion 15 which is the higher positioned stepped portion. This is because the bonding positions for the electronic member 40 are higher than the bonding positions for the semiconductor laser elements 20. However, if the bonding positions for the semiconductor laser elements 20 are higher than the bonding positions for the electronic member 40, the first wires 71 can preferably be bonded to the second stepped portion 15 and the second wires 72 to the first stepped portion 13.

In other words, one end of a first wire 71 is bonded to either a first wiring region 14 or second wiring region 16, and one end of a second wire 72 is bonded to the other of the first wiring region 14 and the second wiring region 16. Furthermore, the other end of the wire between the first wire 71 and the second wire 72, the end bonded to the first wiring region 14 is bonded at a lower position from the bottom face of the base 10 than the other end of the wire bonded to the second wiring region 16. Furthermore, the other end of the wire between the first wire 71 and the second wire 72, the other end bonded to the second wiring region 16 is positioned higher from the bottom face of the base 10 than the first wiring region 14.

Second Embodiment

Figure 5:
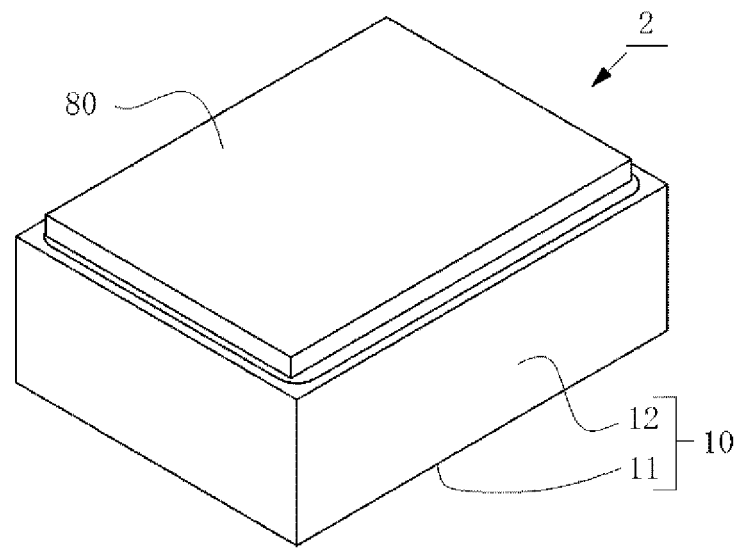
FIG. 5 is a perspective view of a light emitting device according to a second embodiment.
Figure 6:
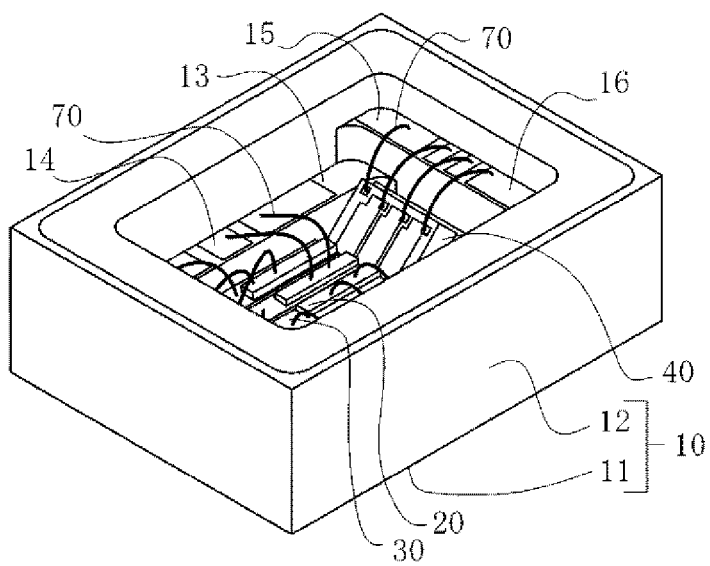
FIG. 6 is a perspective view of the light emitting device according to the second embodiment from which the cover member is removed.
Figure 7:
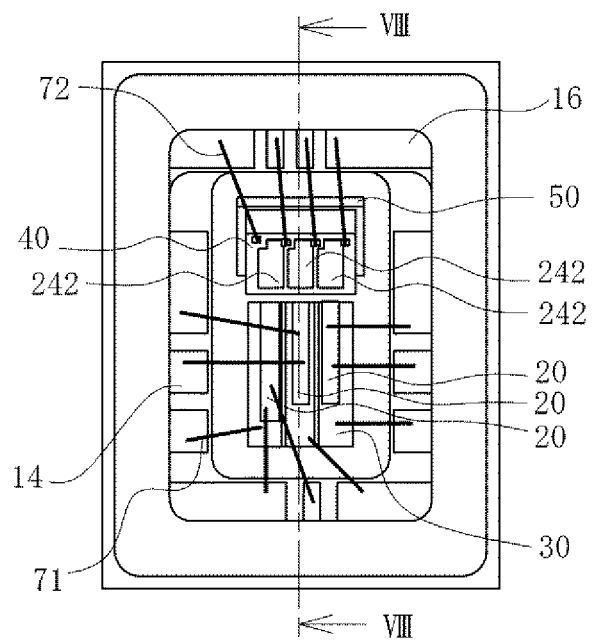
FIG. 7 is a top view of the light emitting device according to the second embodiment from which the cover member is removed.
Figure 8:
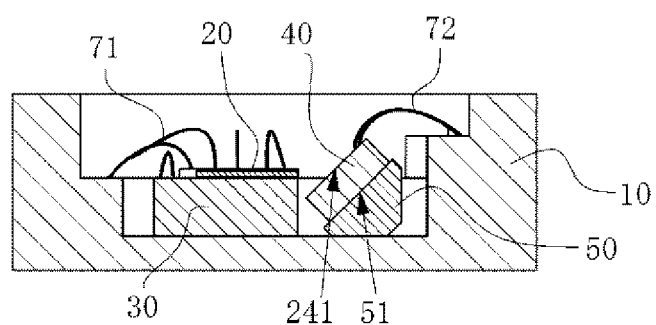
FIG. 8 is a cross-sectional view of the light emitting device taken along line VIII-VIII in FIG.
Figure 9:
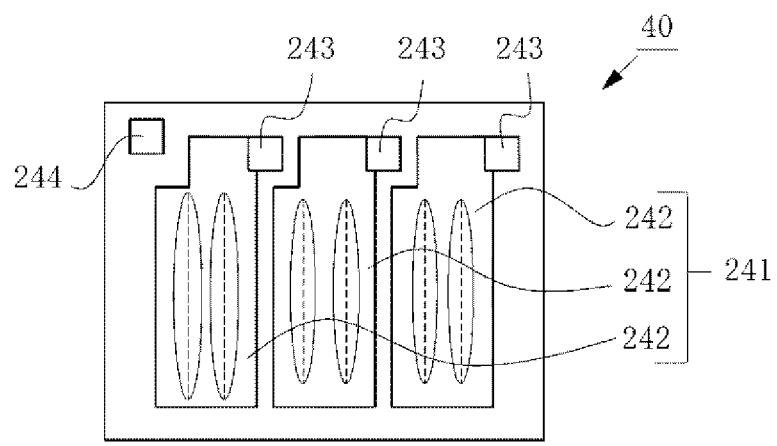
FIG. 9 is a top view of an electronic member according to the second embodiment.

A light emitting device 2 according to a second embodiment will be explained. FIG. 5 to FIG. 9 are drawings explaining an exemplary embodiment of the light emitting device 2. FIG. 5 is a perspective view of the light emitting device 2. FIG. 6 is a perspective view of the light emitting device 2 in the state where the cover member 80 is removed. FIG. 7 is a top view in the same state as in FIG. 6. FIG. 8 is a cross-sectional view taken along line VIII-VIII in FIG. 7. FIG. 9 is a top view when the electronic member 40 according to the second embodiment is viewed from the light-irradiated face. The ellipses in FIG. 9 indicate the regions irradiated by the main portions of the light from the semiconductor laser elements 20. The broken lines indicate the major diameters of the ellipses.

The light emitting device 2 includes, as constituent elements, a base 10, three semiconductor laser elements 20, a submount 30, an electronic member 40, a support member 50, wires 70, and a cover member 80. The light emitting device 2 according to the second embodiment differs from the light emitting device 1 according to the first embodiment by not having an optical member 60. Furthermore, it differs from the light emitting device 1 according to the first embodiment such that the electronic member is a PD.

The light emitting device 2 illustrated in the drawings has the larger number of first wires 71 than the light emitting device 1 shown in FIG. 3. In the light emitting device 2 according to the second embodiment, the three semiconductor laser elements 20 are individually electrically connected such that the outputs can be individually adjusted. Each semiconductor laser element 20 is a multi-emitter having two emitters.

In the light emitting device 2, light receiving regions 242 each corresponding to the light emitted by the three semiconductor laser elements 20 are provided in the light-irradiated face 241 of the electronic member 40. A portion of the light irradiated at each light receiving region 242 is received while the remaining portion is reflected upwards. It is preferable to reflect at least 90% of the light in order to allow the device to output a large amount of light. In the case of the light emitting device 2, three light receiving regions 242 are arranged in a row in the same direction in which the three semiconductor laser elements 20 are arranged in a row.

One light receiving region 242 corresponds to one semiconductor laser element 20, and the light receiving regions 242 are separated. In other words, the light receiving regions 242 are spaced, not overlapping. A bonding region for a second wire 72 for electrical connection is provided in each light receiving region 242.

As shown in FIG. 9, the electronic member 40 has, as the bonding regions for the second wires 72, first bonding regions 243 provided for each light receiving region, and one second bonding region 244 shared by the multiple light receiving regions.

All of the first bonding regions 243 and the second bonding region 244 are provided above the regions to which the main portions of the light from the semiconductor laser elements 20 irradiate. In other words, in the light emitting device 2, the bonding regions are disposed in the positions more distant than the regions irradiated by the main portions of the light from the semiconductor laser elements 20.

In the top view, each light receiving region 242 has a laterally smaller width portion at the upper edge. Specifically, each light receiving region has a shape that has a notched corner at the upper edge. The shape and the position of the laterally narrower width portion are consistent among the light receiving regions 242.

The first bonding regions 243 are disposed in the areas made available by the reduced width portions of the light receiving regions. A first bonding region 243 of a light receiving region 242 laterally projects from the light receiving region 242. In the case in which another light receiving region 242 is provided adjacent thereto in the projecting direction, the projected portion is disposed in the area made available by the reduced width portion of the adjacent light receiving region 242.

The first bonding regions 243 are not provided on the straight lines extending along the major axes of the main portions of the light irradiating the light receiving regions 242. In other words, the first bonding regions 243 are provided in the locations that avoid these straight lines. As shown in FIG. 7 and FIG. 8, the second wires 72 bonded to the first bonding regions 243 extend upwards therefrom and then bonded to the second wiring regions 16. Avoiding the straight lines extending along the major diameters of the beams can inhibit the second wires 72 from blocking the light reflected by the electronic member 40.

A first bonding region 243 arranged between two light receiving regions 242 is provided between the straight lines extending along the major axes of the major portions of light irradiating the two light receiving regions 242. In other words, the first bonding region 243 does not beyond the two straight lines. This can allow the second wire 72 to readily avoid blocking the light reflected by an adjacent light receiving region 242.

Furthermore, a first bonding region 243 projects from one of two opposing adjacent and closest sides of two adjacent light receiving regions 242, and the straight line extending along the other side goes through the first bonding region 243. Such a layout can provide the first bonding regions 243 such that the light receiving regions 242 are in close proximity to one another, thereby contributing to a reduction in the size of the light emitting device 2.

Moreover, in the top view, the second bonding region 244 is disposed in the vicinity of the upper edge and on one of the sides of the electronic member 40 opposite the projecting direction of the first bonding regions 243. The second bonding region 244 is not disposed on the straight line extending along the major axis of the major portion of the beam irradiating the light receiving region 242 closest to the second bonding region 244.

The structure is not limited to one in which each semiconductor laser element 20 corresponds to a light receiving region, i.e., one light receiving region can be provided to receive the lights from multiple semiconductor laser elements 20. A single or plural light receiving regions can be provided in the light-irradiated face 241.

In the light emitting device 2, the PD employed as the electronic par 40 can receive a predetermined percentage of the light irradiating the light-irradiated face 241. The optical control unit can calculate the amount of light output by the light emitting device 2 and the amount of light reflected by the electronic member 40 based on the amount of light received. Based on the calculation results, various controls can be performed such as an adjustment of the intensity of light emitted by the semiconductor laser elements 20.

Third Embodiment

Figure 10:
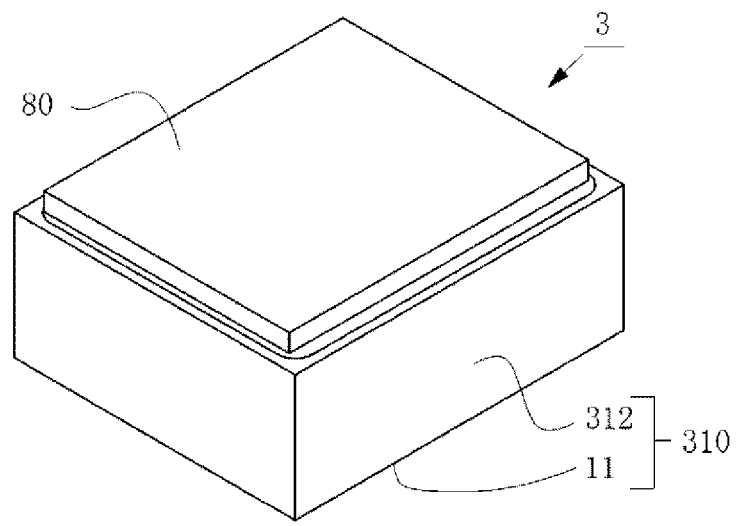
FIG. 10 is a perspective view of a light emitting device according to a third embodiment.
Figure 11:
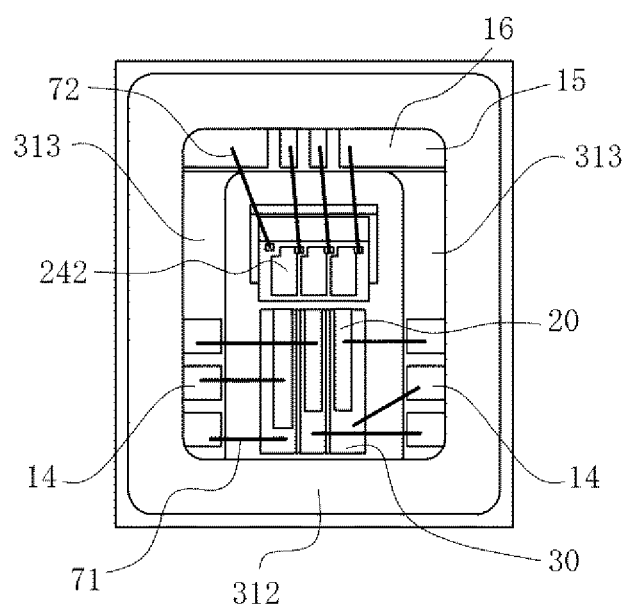
FIG. 11 is a top view of the light emitting device according to the third embodiment from which the cover is removed.

FIG. 10 is a perspective view of a light emitting device 3 according to a third embodiment. FIG. 11 is a top view of the light emitting device 3 shown in FIG. 10 in the state where the cover member 80 is removed.

The light emitting device 3 includes, as constituent elements, a base 310, three semiconductor laser elements 20, a submount 30, an electronic member 40, a support member 50, wires 70, and a cover member 80. As compared to the base 10 according to the first and second embodiments, positions of the stepped portions are different in the light emitting device 3 according to the third embodiment. Furthermore, as compared to the light emitting devices 1 and 2, the light emitting device 3 has a fewer number of first wiring regions 14 that need to be secured.

The number of the first wiring regions 14 to be secured is affected by, for example, the number of semiconductor laser elements 20. In the case of making the semiconductor laser elements 20 independently operable, the number of necessary wiring regions increases as the number of semiconductor laser elements 20 increases. Assuming that the wiring regions are provided in the first stepped portion described above, the number of first wiring regions 14 would increase.

For example, the number of the first wiring regions 14 to be secured can also be affected by the number of emitters each semiconductor laser element 20 has. In the case of making the emitters of the semiconductor laser elements 20 independently operable, the number of necessary wiring regions increases as the number of emitters increases. Assuming that such wiring regions are provided in the first stepped portion, the number of the first wiring regions 14 would increase.

In the light emitting device 3 illustrated in the drawings, each of the three semiconductor laser elements 20 has a single emitter. The number of the first wiring regions can vary depending on not only this, but on other factors. For example, there are instances where protective devices such as Zener diodes are provided to protect the semiconductor laser elements 20.

Depending on the number of necessary first wiring regions, the area to be secured as the first stepped portion changes. Reducing the size of the base by appropriately designing the area where the first stepped portion is formed can lead to size reduction of the light emitting device.

In the lateral part 312 of the light emitting device 3, no inner lateral face of the first stepped portion 313 is provided in the first of the two opposing planar regions between which the semiconductor laser elements 20 and electronic member 40 are interposed in series, the first of the two opposing planar regions having a smaller distance from the electronic member 40 than from the semiconductor laser elements 20. This can allow for a design of a small light emitting device.

In the light emitting device 3 illustrated in the drawings, the first stepped portion 313 has two opposing inner lateral faces between which the semiconductor laser elements and the electronic member are interposed in parallel. No stepped portion defining an inner lateral face is provided in the second of the two opposing planar regions between which the semiconductor laser elements 20 and electronic member 40 are interposed in series, the second of the two opposing planar regions having a larger distance from the electronic member 40 than from the semiconductor laser elements 20.

In the light emitting device 3, the first stepped portion 313 is formed in the regions that do not intersect any straight line perpendicular to the emission faces of the semiconductor laser elements 20 while passing through the three semiconductor laser elements 20 in the top view.

Light emitting devices according to certain embodiments have been described above, but light emitting devices according to the present invention are not strictly limited to those described above. In other words, the present invention can be achieved without being limited to the external shapes and structures of the light emitting devices disclosed by the embodiments. Furthermore, the present invention is applicable to a device without making it essential to necessarily include all of the constituent elements of the described embodiments. For example, in the event that a certain component of a light emitting device included in any of the embodiments is not recited in the claims, the claimed invention can still be applicable in view of the design flexibility of a person of ordinary skill in the art for such a component through the use of an alternative, an omission, a change in shapes or materials employed, or the like.

The light emitting devices disclosed with reference to the embodiments described above can be used in head-mounted displays, projectors, automotive headlights, lighting fixtures, displays, and the like.

What is claimed is:

1. A light emitting device comprising:
   a base having a bottom face and a lateral part surrounding the bottom face and extending upwards from the bottom face, wherein the lateral part comprises a first stepped portion and a second stepped portion that are each defined by an inner lateral face and an upper face, and wherein a height of the second stepped portion from the bottom face is greater than a height of the first stepped portion from the bottom face;
   a light emitting element disposed on the bottom face;
   an electronic member disposed on the bottom face and configured to be irradiated by light emitted from the light emitting element;
   a first wiring region located on the first stepped portion;
   a second wiring region located on the second stepped portion;
   a plurality of wires connected to the light emitting element and the electronic member, the plurality of wires including:
      a first wire having a first end that is connected to the first wiring region, and a second end, and
      a second wire having a first end that is connected to the second wiring region, and a second end;
   wherein a position of the second end of the first wire relative to the bottom face, is lower than a position of the second end of the second wire relative to the bottom face.

2. The light emitting device according to claim 1, wherein the light emitting element and the electronic member are connected to the first and second wires.

3. The light emitting device according to claim 2, wherein the second end of the first wire is connected to the light emitting element, and
the second end of the second wire is connected to the electronic member.

4. The light emitting device according to claim 3, further comprising:
   a submount on which the light emitting element is arranged;

wherein the second end of the first wire is bonded to an upper face of the light emitting element or an upper face of the submount.

5. The light emitting device according to claim 1, wherein:
   the inner lateral face of the first stepped portion meets the bottom face; and
   the inner lateral face of the second stepped portion meets the bottom face.

6. The light emitting device according to claim 1, wherein:
   a length of a portion where the inner lateral face of the second stepped portion meets the bottom face is larger than a length of a portion where the inner lateral face of the second stepped portion meets the upper face of the first stepped portion.

7. The light emitting device according to claim 1, wherein:
   the base comprises a bottom part having the bottom face; and
   the lateral part and the bottom part are monolithic.

8. The light emitting device according to claim 1, wherein:
   the base comprises a bottom part having the bottom face; and
   a thermal conductivity of the bottom part is higher than a thermal conductivity of the lateral part.

9. The light emitting device according to claim 1, wherein:
   the electronic member is configured to be irradiated by an entire main portion of the light emitted from the light emitting element.

10. The light emitting device according to claim 9, wherein:
    the electronic member is configured to allow at least 80% of the main portion of the light radiating in a predetermined direction from the light emitting element to radiate in a direction different from the predetermined direction.

11. The light emitting device according to claim 1, wherein:
    the electronic member comprises a microelectromechanical system or a photodiode.

12. The light emitting device according to claim 1, wherein:
    the electronic member is configured such that a face of the electronic member on which the light emitted from the light emitting element irradiates is inclined at an angle of 10 to 80 degrees relative to the bottom face.

13. The light emitting device according to claim 1, wherein:
    an inner lateral face of the second stepped portion is formed in a first of two opposing planar regions between which the light emitting element and the electronic member are interposed in series, the first of the planar regions having a shorter distance from the electronic member than from the light emitting element.

14. The light emitting device according to claim 13, wherein:
    inner lateral faces of the first stepped portion are formed in two opposing planar regions between which the light emitting element and the electronic member are interposed in parallel.

15. The light emitting device according to claim 14, wherein:
    no inner lateral face of the first stepped portion is formed in the first of the two opposing planar regions between which the light emitting element and the electronic member are interposed in series.

16. The light emitting device according to claim 15, wherein:
    an inner lateral face of the first stepped portion is formed in a second of the two planar opposing regions between which the light emitting element and the electronic member are interposed in series, the second of the two planar regions having a longer distance from the electronic member than from the light emitting element.

17. The light emitting device according to claim 1, further comprising:
    a support member disposed on the bottom face of the base and having an oblique face oblique to the bottom face, wherein the electronic member is disposed on the oblique face of the support member.

18. The light emitting device according to claim 1, further comprising:
    a cover member bonded to the upper face of the base at a position higher than the second stepped portion, and hermetically sealing a space in which the light emitting element is disposed.

* * * * *